US009165634B2

(12) United States Patent
Song

(10) Patent No.: US 9,165,634 B2
(45) Date of Patent: Oct. 20, 2015

(54) SEMICONDUCTOR MEMORY DEVICE AND REFRESH CONTROL SYSTEM

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/341,451

(22) Filed: Jul. 25, 2014

(65) Prior Publication Data

US 2015/0255140 A1    Sep. 10, 2015

(30) Foreign Application Priority Data

Mar. 7, 2014    (KR) .................. 10-2014-0027233

(51) Int. Cl.
G11C 7/00    (2006.01)
G11C 11/406    (2006.01)
G11C 11/408    (2006.01)

(52) U.S. Cl.
CPC ............ G11C 11/406 (2013.01); G11C 11/408 (2013.01)

(58) Field of Classification Search
CPC ........... G11C 11/406; G11C 11/40618; G11C 11/40622
USPC ................. 365/222, 230.08, 189.07
See application file for complete search history.

(56) References Cited

U.S. PATENT DOCUMENTS

| 2003/0067825 | A1* | 4/2003 | Shimano et al. | 365/222 |
| 2008/0253212 | A1* | 10/2008 | Iida et al. | 365/222 |
| 2011/0158024 | A1* | 6/2011 | Kim et al. | 365/222 |
| 2015/0049567 | A1* | 2/2015 | Chi | 365/222 |

FOREIGN PATENT DOCUMENTS

KR    1019990073988    10/1999

* cited by examiner

*Primary Examiner* — Tuan T Nguyen
(74) *Attorney, Agent, or Firm* — IP & T Group LLP

(57) ABSTRACT

A semiconductor memory device includes an address latch unit suitable for consecutively latching first refresh addresses, which correspond to successively-activated word lines, from consecutively received addresses for word lines to be activated in response to word line hit signals identifying the successively-activated word lines; an address comparison unit suitable for generating a comparison result signal by comparing the previously latched first address with the currently latched first address; a refresh control unit suitable for selecting a first refresh operation corresponding to the currently latched first address, and a second refresh operation corresponding to a second address in response to the comparison result signal, and a refresh command signal; and a refresh operation unit suitable for performing the first and second refresh operations on memory cells therein according to the selection of the refresh control unit.

20 Claims, 5 Drawing Sheets

SEMICONDUCTOR MEMORY DEVICE AND REFRESH CONTROL SYSTEM

CROSS-REFERENCE TO RELATED APPLICATIONS

The present application claims priority of Korean Patent Application No. 10-2014-0027233, filed on Mar. 7, 2014, which is incorporated herein by reference in its entirety.

BACKGROUND

1. Field

Various exemplary embodiments of the present invention relate to a semiconductor design technology and, more particularly, to a semiconductor memory device that performs refresh operations and a refresh control system.

2. Description of the Related Art

Semiconductor memory devices such as double data rate synchronous dynamic random access memory (DDR SDRAM) include memory banks for storing data and each memory bank includes memory cells. Each memory cell has a cell capacitor and a cell transistor and the semiconductor memory device stores data by charging or discharging the cell capacitor.

It would be ideal if the charge in the capacitor remained constant. However, the charge stored in the cell capacitor varies due to voltage differences between the semiconductor memory device and peripheral circuits. That is, the electrical charge may leak from a charged capacitor or be unintentionally charged when it should remain discharged. This unwanted charging and discharging may result in the loss of data. To combat this concern, semiconductor memory devices perform refresh operations to keep their charges at intended levels and prevent the loss of stored data.

The degree of integration of memory devices is constantly increasing and this means the size of memory cells and memory banks have to decrease as well. Also, the distance between memory cells and their corresponding word lines is also decreasing. This has resulted in an increase in electrical phenomena that affect the memory cell charges. For instance, there may be electrical coupling effects between adjacent word lines.

In a semiconductor memory device, word lines must become active (increase or decrease in voltage) to read or write from/to memory cells. As the distance between word lines decreases, this coupling effect is intensified and memory cells connected to adjacent word lines may have their charge (voltage level) influenced due to the coupling effect. Since data is stored by the charge, this may result the loss of data.

To prevent loss of data, memory cells are refreshed to keep the memory cell charges at or near their intended levels. This must be before the charge in the memory cells has been lost. However, it should not been done more than necessary as refresh operations deteriorate the operating efficiency of semiconductor memory devices. Therefore, much effort is spent on perfecting refresh operations to ensure data is accurately maintained while keeping the memory device operating as efficiently as possible.

SUMMARY

Various exemplary embodiments of the present invention are directed to a semiconductor memory device capable of efficiently controlling refresh operations.

In accordance with an exemplary embodiment of the present invention, a semiconductor memory device may include: an address latch unit suitable for consecutively latching first refresh addresses, which correspond to successively-activated word lines, from consecutively received addresses for word lines to be activated in response to word line hit signals identifying the successively-activated word lines; an address comparison unit suitable for generating a comparison result signal by comparing the previously latched first address with the currently latched first address; a refresh control unit suitable for selecting one of a first refresh operation corresponding to the currently latched first address, and a second refresh operation corresponding to a second address in response to the comparison result signal, and a refresh command signal; and a refresh operation unit suitable for performing the first and second refresh operations on memory cells therein according to the selection of the refresh control unit.

The semiconductor memory device may further include an address generation unit suitable for generating the second address; and an address output unit suitable for outputting one of the first addresses latched by the address latch unit, and the second address according to the selection of the refresh control unit.

The refresh control unit may select the first refresh operation in response to a predetermined first input sequence of the refresh command signal in a direct mode.

The refresh control unit may select the first refresh operation in response to a predetermined first input sequence of the refresh command signal when the previously latched first address is different from the currently latched first address in a comparing mode.

The refresh control unit may select the second refresh operation in response to a predetermined first input sequence of the refresh command signal when the previously latched first address is the same as the currently latched first address in a comparing mode.

The semiconductor memory device may further comprise a reset signal generation unit for resetting the address latch unit a predetermined time after the refresh operation unit performs the first refresh operation to the currently latched first address in the comparing mode.

The refresh control unit may select the second refresh operation in response to a predetermined second input sequence of the refresh command signal.

In accordance with another exemplary embodiment of the present invention, a refresh control system may include: a controller suitable for generating a refresh command signal, and suitable for generating one of a first refresh address, and a second refresh address based on a latched time of the first refresh address, which corresponds to a successively-activated word line during an active operation, and a warranty time of the first refresh operation; and a semiconductor memory device suitable for performing a first refresh operation corresponding to the first refresh address, and the second refresh operation corresponding to a second refresh address in response to the refresh command signal.

The controller may comprise an address latch unit suitable for consecutively latching first refresh addresses, which correspond to successively-activated word lines, from consecutively received addresses for word lines to be activated in response to word line hit signals identifying the successively-activated word lines; an address comparison unit suitable for generating a comparison result signal by comparing the previously latched first address with the currently latched first address; a refresh control unit suitable for selecting one of a first refresh operation corresponding to the currently latched first address, and a second refresh operation corresponding to a second address in response to the comparison result signal, and the refresh command signal; and a command generation unit suitable for generating the refresh command signal corresponding to the first refresh operation according to the selection of the refresh control unit.

The controller may further comprise a reset signal generation unit suitable for generating a reset signal in response to the comparison result signal and the warranty time of the first refresh operation. The address latch unit may be reset in response to the reset signal.

The refresh control unit may select the first refresh operation in response to a predetermined first input sequence of the refresh command signal in a direct mode.

The refresh control unit may select the first refresh operation in response to a predetermined first input sequence of the refresh command signal when the previously latched first address is different from the currently latched first address in a comparing mode.

The refresh control unit may select the second refresh operation in response to a predetermined first input sequence of the refresh command signal when the previously latched first address is the same as the currently latched first address in a comparing mode.

The controller may further comprise a reset signal generation unit for resetting the address latch unit a predetermined time after the refresh operation unit performs the first refresh operation to the currently latched first address in the comparing mode.

The refresh control unit may select the second refresh operation in response to a predetermined second input sequence of the refresh command signal.

According to the semiconductor memory device of the embodiments, it is possible to efficiently control refresh operations of a semiconductor memory device.

DETAILED DESCRIPTION

Figure 1:
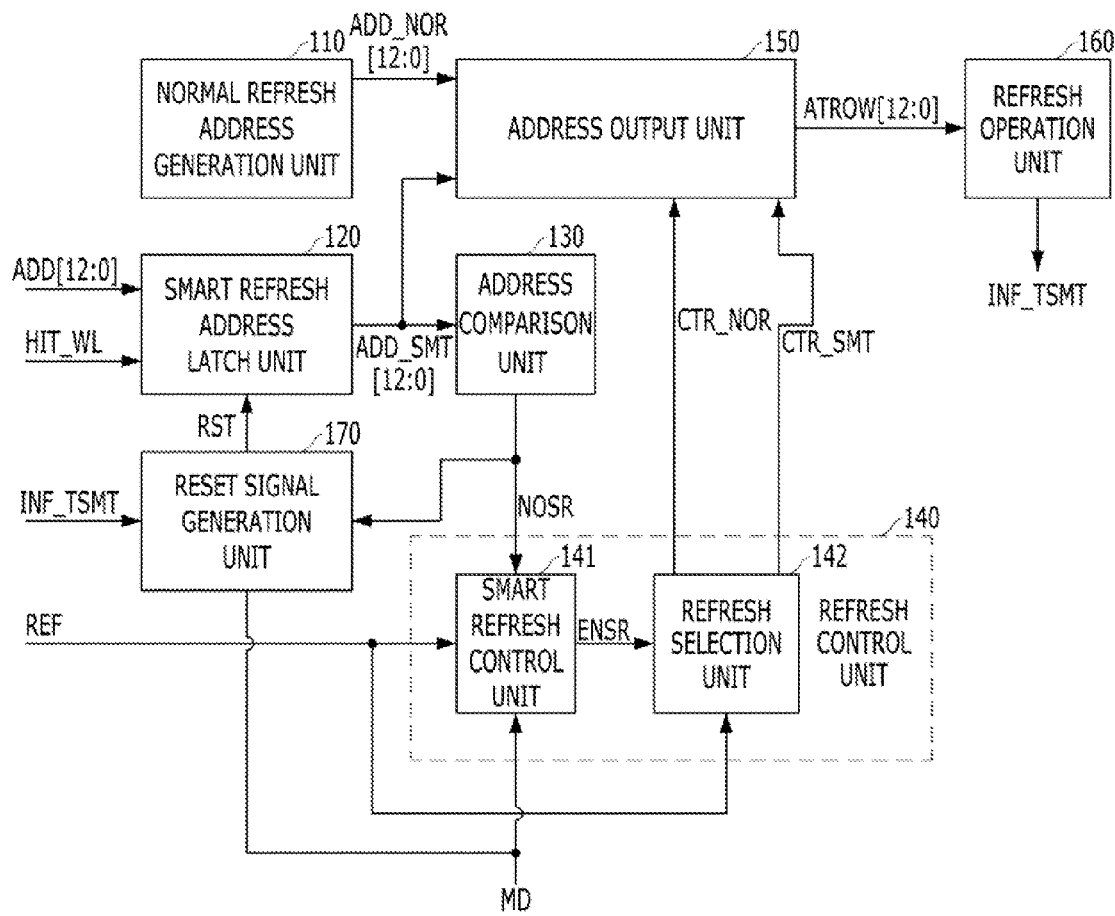
FIG. 1 is a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned.

FIG. 1 is a block diagram illustrating a semiconductor memory device in accordance with an exemplary embodiment of the present invention.

Refresh operations performed in the exemplary embodiments of the present invention may be classified into two types, that is, normal and smart refresh operations. The normal refresh operation may be performed in response to a normal refresh command such as a self refresh command or an auto refresh command. The smart refresh operation may be performed on an adjacent word line.

The smart refresh operation will be described in more detail, When a word line is successively-activated in response to refresh commands, a disturbance occurs in the word line adjacent to the successively-activated word line. That is, the voltage level of the adjacent word line may become unstable. Accordingly, data stored in the adjacent word line may be lost. To prevent this concern, a refresh operation according to the exemplary embodiments of the present invention is performed and data loss may be prevented.

Referring to FIG. 1, the semiconductor memory device may include a normal refresh address generation unit 110, a smart refresh address latch unit 120, an address comparison unit 130, a refresh control unit 140, an address output unit 150, and a refresh operation unit 160.

The normal refresh address generation unit 110 may generate an address corresponding to a normal refresh operation (hereinafter, referred to as a 'normal refresh address ADD_NOR[12:0]'). Though not shown in FIG. 1, the normal refresh address ADD_NOR[12:0] corresponds to a word line coupled to each of a plurality of memory cells.

The smart refresh address latch unit 120 may latch a smart refresh address ADD_SMT[12:0] corresponding to a smart refresh operation. Here, though not shown in FIG. 1, the smart refresh address ADD_SMT[12:0] corresponds to the successively-activated word line coupled to each of the plurality of memory cells. The smart refresh address latch unit 120 may latch the smart refresh address ADD_SMT[12:0] from an input address ADD[12:0] corresponding to a word line currently being accessed in response to a word line hit signal HIT_WL identifying the successively-activated word line to latch the smart refresh address ADD_SMT[12:0] corresponding to the successively-activated word line. The word line hit signal HIT_WL is activated when the active operation is successively performed on the same word line. For another example, the smart refresh address ADD_SMT[12:0] may correspond to the word lines adjacent to the successively-activated word line.

The address comparison unit 130 may generate a comparison result signal NOSR by comparing a previously latched smart refresh address ADD_SMT[12:0] with a currently latched smart refresh address ADD_SMT[12:0]. When the previously latched smart refresh address ADD_SMT[12:0] is identical to the currently latched smart refresh address ADD_SMT[12:0], the word line currently activated may be the successively-activated word line, which has been activated at least twice. For example, the address comparison unit 130 may output the comparison result signal NOSR having a logic low level when the previously latched smart refresh address ADD_SMT[12:0] is different from the currently latched smart refresh address ADD_SMT[12:0] and may output the comparison result signal NOSR having a logic high level when the previously latched smart refresh address ADD_SMT[12:0] is identical to the currently latched smart refresh address ADD_SMT[12:0].

The refresh control unit 140 may select one of the normal refresh operations and the smart refresh operations in response to the comparison result signal NOSR, a refresh command signal REF, and a mode selection signal MD. The refresh control unit 140 may include a smart refresh control unit 141 and a refresh selection unit 142. The smart refresh operation of the semiconductor memory device in accordance with the exemplary embodiment of the present invention may perform operations in one of a direct mode and a comparing mode according to the mode selection signal MD. For example, the mode selection signal MD of a logic low level may indicate the direct mode, and the mode selection signal MD of a logic high level may indicate the comparing mode. In the direct mode, the refresh control unit 140 may ignore the comparison result signal NOSR, which means that the smart refresh operation may be performed without comparing the previously latched smart refresh address ADD_SMT[12:0] with the currently latched smart refresh address ADD_SMT[12:0]. In the comparing mode, the smart refresh operation is performed based on the comparison result signal NOSR, which means that the comparison result of the address comparison unit 130 may be reflected on the smart refresh operation.

The refresh selection unit 142 may generate a normal refresh control signal CTR_NOR corresponding to the normal refresh operation and a smart refresh control signal CTR_SMT corresponding to the smart refresh operation according to an activation control signal ENSR.

The smart refresh control unit 141 may generate an activation control signal ENSR by counting the refresh command signal REF according to the mode selection signal MD and the comparison result signal NOSR.

Figure 2:
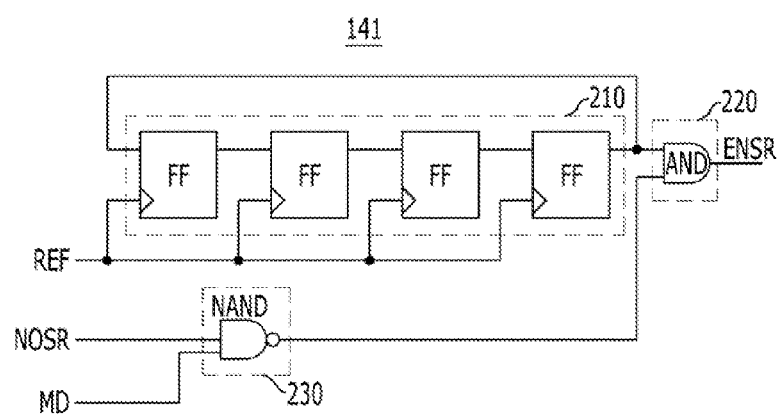
FIG. 2 is a detailed block diagram illustrating a smart refresh control unit shown in FIG. 1.

FIG. 2 is a detailed block diagram illustrating the smart refresh control unit 141 shown in FIG. 1. As an example, it is assumed that the ratio of the refresh operations to the smart refresh operations is set to 4:1. That is, the smart refresh operations may be performed once per four activations of the refresh command signal REF.

Referring to FIG. 2, the smart refresh control unit 141 may include a shifting section 210, an output control section 220, and a mode control section 230. The shifting section 210 may perform a shift operation in response to the refresh command signal REF. The output control section 220 may output an output signal of the shifting section 210 as the activation control signal ENSR in response to the comparison result signal NOSR. The mode control section 230 may select one of the direct mode and a comparing mode according to the mode selection signal MD. The shifting section 210 may include four flip-flops and the output control section 220 may include a logic gate AND, which performs an AND operation on the output signal of the shifting section 210 and an output signal of the mode control section 230 to transfer the output signal of the shifting section 210 as the activation control signal ENSR in response to the comparison result signal NOSR. The mode control section 230 may include a logic gate NAND performing a NAND operation on the comparison result signal NOSR and the mode selection signal MD to transfer the comparison result signal NOSR to the logic gate AND in response to the mode selection signal MD.

Hereinafter, an operation of the semiconductor memory device shown in FIGS. 1 and 2 will be explained in detail.

In the direct mode, where the mode selection signal MD has a logic low level, the activation control signal ENSR is generated by the shift operation of the shifting section 210 irrespective of the comparison result signal NOSR. That is, when the refresh command signal REF is activated four times, the activation control signal ENSR may be activated in response to one of the four refresh command signals REF. This means that the normal refresh operation is performed in response to first to third refresh command signals REF while the smart refresh operation is performed in response to a fourth refresh command signal REF. A detailed description will be explained in FIG. 3.

In the comparing mode, where the mode selection signal MD has a logic high level, the activation of the activation control signal ENSR may depend on the comparison result signal NOSR even though the refresh command signal REF is activated four times. That is, even when the refresh command signal REF is activated four times, the activation control signal ENSR may not be activated in response to the comparison result signal NOSR. This means that a normal refresh operation instead of a smart refresh operation may be performed in response to the fourth refresh command signal REF, and the deactivated activation control signal ENSR. A detailed description will be explained with reference to FIGS. 4A and 4B.

Referring back to FIG. 1, the refresh selection unit 142 may selectively output one of the normal refresh control signal CTR_NOR and the smart refresh control signal CTR_SMT in response to the refresh command signal REF and the activation control signal ENSR. The refresh selection unit 142 may output the normal refresh control signal CTR_NOR in response to the refresh command signal REF, and may output the smart refresh control signal CTR_SMT in response to the activation control signal ENSR as well as the refresh command signal REF.

The address output unit 150 may output a final refresh address ATROW[12:0] by selecting one of the normal refresh address ADD_NOR[12:0] and the smart refresh address ADD_SMT[12:0] in response to the normal refresh control signal CTR_NOR and the smart refresh control signal CTR_SMT.

The refresh operation unit 160 may perform one of the normal refresh operation and the smart refresh operation based on the final refresh address ATROW[12:0]. The refresh operation unit 160 may include a word line decoder (not shown), a memory bank (not shown) and the like. The memory bank may include a plurality of memory cells corresponding to the final refresh address ATROW[12:0], and the word line decoder may control an access operation on a word line coupled to each of the plurality of memory cells based on the final refresh address ATROW[12:0].

The semiconductor memory device in accordance with the exemplary embodiments of the present invention may compare the previously and currently latched addresses for the smart refresh operation, and may selectively perform the normal refresh operation and the smart refresh operation in response to the comparison result. In particular, when the previously latched address is identical to the currently latched address, it is possible to skip/omit the smart refresh operation.

Figure 3:
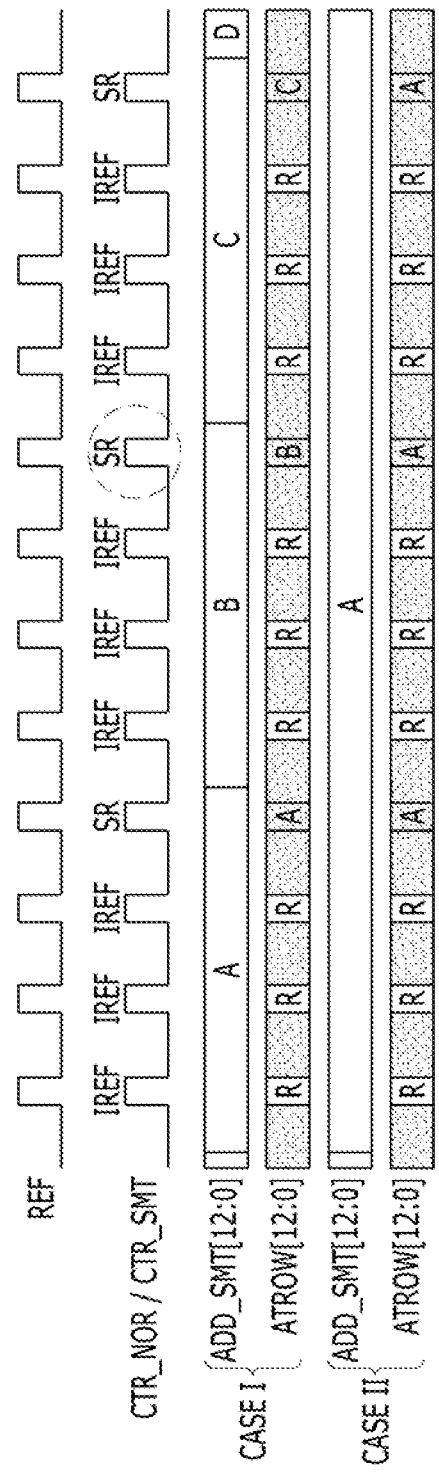
FIGS. 3, 4A, and 4B are timing diagrams illustrating operations of the semiconductor memory device shown in FIGS. 1 and 2.
Figure 4A:
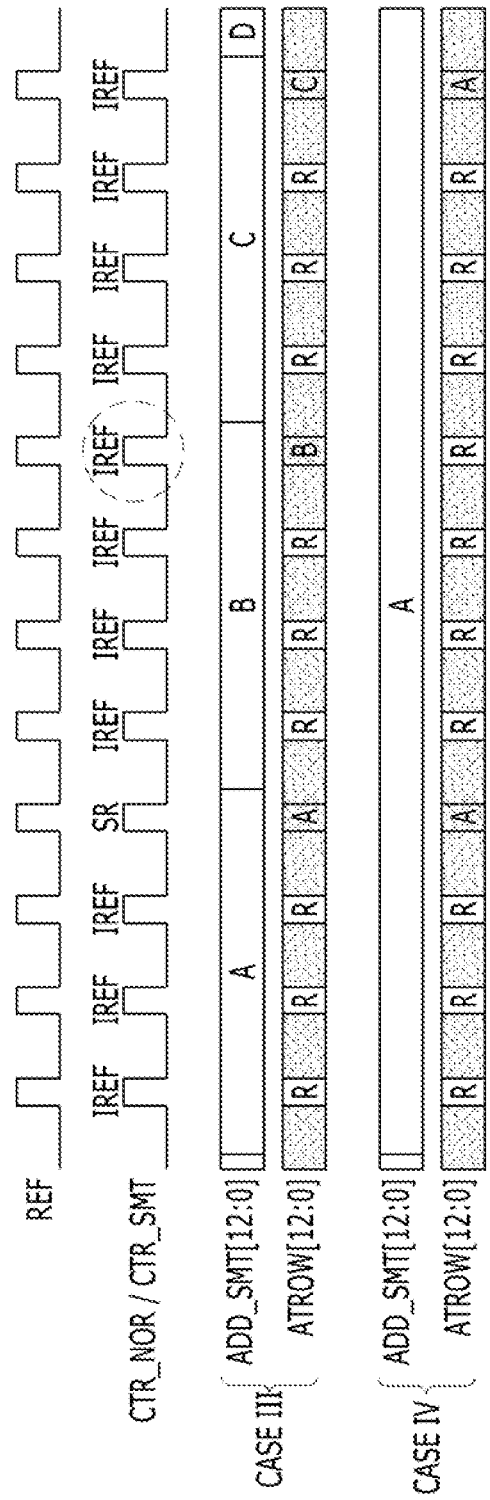
Figure 4B:
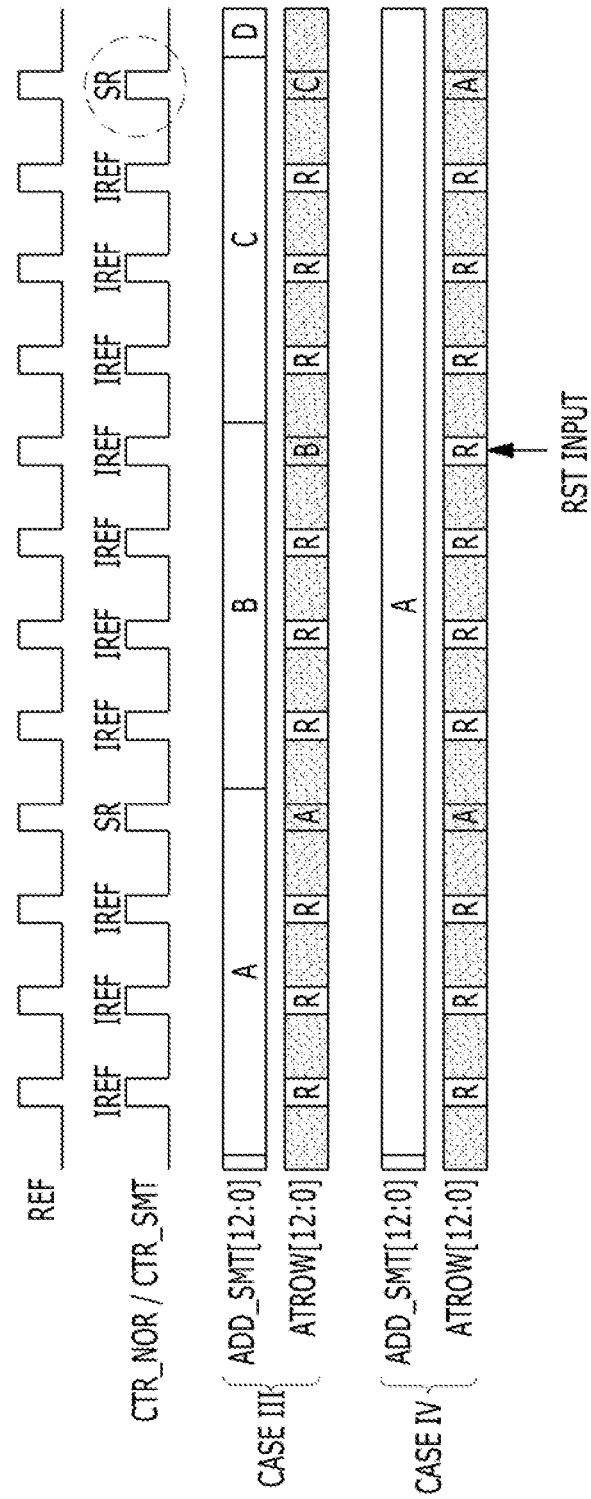

FIGS. 3, 4A, and 4B are timing diagrams explaining operations of the semiconductor memory device shown in FIGS. 1 and 2.

FIG. 3 shows the direct mode, where the smart refresh operation is performed without comparing the previously latched smart refresh address ADD_SMT[12:0] with the currently latched smart refresh address ADD_SMT[12:0].

FIG. 3 shows the refresh command signal REF, the normal refresh control signal CTR_NOR, the smart refresh control signal CTR_SMT, the smart refresh address ADD_SMT[12:0] and the final refresh address ATROW[12:0]. Referring to FIG. 3, the normal refresh operation IREF may be performed in response to the normal refresh control signal CTR_NOR, and the smart refresh operation SR may be performed in response to the smart refresh control signal CTR_SMT.

In CASE I, the previously latched smart refresh address ADD_SMT[12:0] 'A' is different from the currently latched smart refresh address ADD_SMT[12:0] 'B'. In a first cycle of CASE I, the final refresh address ATROW[12:0] 'R' may correspond to the normal refresh operation 'IREF' three times for first to third refresh command signals REF per 4 refresh command signals REF, and then the final refresh address ATROW[12:0] 'A' may correspond to the smart refresh operation 'SR' for a fourth refresh command signal REF per 4 refresh command signals REF. In the next cycle, the final refresh address ATROW[12:0] 'B' may correspond to the smart refresh operation 'SR' after three times of the final refresh address ATROW[12:0] 'R' corresponding to the normal refresh operations 'IREF'. In the next cycle, the final refresh address ATROW[12:0] 'C' may correspond to the smart refresh operation 'SR' after three times of the final refresh address ATROW[12:0] 'R' corresponding to the normal refresh operation 'IREF' three times.

In CASE II, the previously latched smart refresh address ADD_SMT[12:0] 'A' is identical to the currently latched smart refresh address ADD_SMT[12:0] 'A'. In CASE II, the final refresh address ATROW[12:0] 'R' may correspond to the normal refresh operation 'IREF' three times for the first to third refresh command signals REF per 4 refresh command signals REF, and then the final refresh address ATROW[12:0] 'A' may correspond to the smart refresh operation 'SR' for a fourth refresh command signal REF per 4 refresh command signals REF. In the next cycles, the final refresh address ATROW[12:0] 'A' may correspond to the smart refresh operation 'SR' after the three times of the final refresh address ATROW[12:0] 'R' corresponding to the normal refresh operations 'IREF' three times per 4 refresh command signals REF.

FIG. 4A shows the comparing mode, where the smart refresh operation is performed based on the comparison result signal NOSR of the address comparison unit 130 comparing the previously latched smart refresh address ADD_SMT[12:0] with the currently latched smart refresh address ADD_SMT[12:0].

Referring to FIG. 4A, in CASE III, the previously latched smart refresh address ADD_SMT[12:0] 'A' is different from the currently latched smart refresh address ADD_SMT[12:0] 'B'. The semiconductor memory device of CASE III may perform the operation as CASE I described above with reference to FIG. 3. In CASE IV, the previously latched smart refresh address ADD_SMT[12:0] 'A' is identical to the currently latched smart refresh address ADD_SMT[12:0] 'A'. As marked with the dotted line, the normal refresh operation 'IREF' is performed instead of the smart refresh operation 'SR' in response to the fourth refresh command signal REF during the second cycle, unlike the refresh operation described with reference to CASE II of FIG. 3. In other words, during the first cycle, the normal refresh operation 'IREF' corresponding to the final refresh address ATROW[12:0] 'R' is performed three times in response to the first to third refresh command signals REF, and then the smart refresh operation 'SR' corresponding to the final refresh address ATROW[12:0] 'A' is performed once in response to fourth refresh command signals REF. On the contrary, during the second cycle, the normal refresh operation 'IREF' corresponding to the final refresh address ATROW[12:0] 'R' is performed three times in response to the first to third refresh command signals REF, and then the normal refresh operation 'IREF' corresponding to the final refresh address ATROW[12:0] 'R' instead of the smart refresh operation 'SR' in response to the fourth refresh command signal REF is performed as marked in the dotted line. Here, the normal refresh operation 'IREF' marked in the dotted line of FIG. 4 replaces the smart refresh operation 'SR' in the second cycle described above with reference to CASE II of FIG. 3, and such replacement is because the previously latched smart refresh address ADD_SMT[12:0] 'A' is identical to the currently latched smart refresh address ADD_SMT[12:0] 'A'. The operation of the semiconductor memory device during the next cycles may be the same as the second cycle.

The smart refresh operation 'SR' may be performed during a third cycle in CASE IV even when the previously latched smart refresh address ADD_SMT[12:0] 'A' is identical to the currently latched smart refresh address ADD_SMT[12:0] 'A'. Such an operation may be accomplished by resetting the smart refresh address latch unit 120. The reset function of the smart refresh address latch unit 120 may mean that an address latched in the smart refresh address latch unit 120, i.e., the smart refresh address ADD_SMT[12:0], is initialized.

Referring back to FIG. 1, the semiconductor memory device may further include a reset signal generation unit 170. The reset signal generation unit 170 may generate a reset signal RST by comparing the comparison result signal NOSR of the address comparison unit 130 with a smart refresh maximum warranty time INF_TSMT. The smart refresh maximum warranty time INF_TSMT may be a maximum time between smart refresh operations on a successively-activated word line. The smart refresh maximum warranty time INF_TSMT may be outputted from the refresh operation unit 160.

The semiconductor memory device in accordance with an exemplary embodiment of the present invention may control the smart refresh operation in response to the smart refresh maximum warranty time INF_TSMT.

The reset signal generation unit 170 may detect whether the smart refresh address ADD_SMT[12:0] has been latched in the smart refresh address latch unit 130 for a time longer than the smart refresh maximum warranty time INF_TSMT by counting the activation of the comparison result signal NOSR of the address comparison unit 130, and comparing the counted number of activations of the comparison result signal NOSR with the smart refresh maximum warranty time INF_TSMT.

The reset signal RST may be activated when the smart refresh address ADD_SMT[12:0] has been latched by the smart refresh address latch unit 130 for a time longer than the smart refresh maximum warranty time INF_TSMT. The smart refresh address latch unit 120 may be initialized in response to the activation of the reset signal RST.

FIG. 4B shows the comparing mode of the semiconductor memory device having the reset signal generation unit 170, where the in smart refresh operation is performed based on the comparison result signal NOSR of the address comparison unit 130 comparing the previously latched smart refresh address ADD_SMT[12:0] with the currently latched smart refresh address ADD_SMT[12:0].

Referring to CASE IV shown in FIG. 4B, by activating the reset signal RST when the smart refresh address ADD_SMT[12:0] has been latched by the smart refresh address latch unit 120 for a time longer than the smart refresh maximum warranty time INF_TSMT, for example a single cycle or 4 inputs of the refresh command signal REF, the semiconductor memory device may control the smart refresh operation 'SR' to be performed as shown in the third cycle of CASE IV shown in FIG. 4B; otherwise, the semiconductor memory device may control the normal refresh 'IREF' to be performed as the second cycle of CASE IV shown in FIG. 4B.

In conclusion, the refresh operation unit 160 of FIG. 1, may provide the smart refresh maximum warranty time INF_TSMT including the process characteristics such as memory cells, word lines and the like and the semiconductor memory device may perform the normal and smart refresh operations based on the smart refresh maximum warranty time INF_TMT.

The reset signal generation unit 170 may be deactivated in the direct mode, and may be activated in the comparing mode according to the mode selection signal MD.

So far, an exemplary embodiment of the present invention has been demonstrated in a semiconductor memory device. Now, another exemplary embodiment will be captured in the form of a memory controller.

Figure 5:
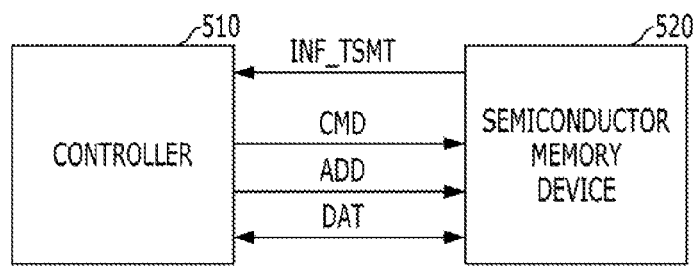
FIG. 5 is a block diagram illustrating a refresh control system in accordance with another exemplary embodiment of the present invention.

FIG. 5 is a block diagram illustrating a refresh control system in accordance with another exemplary embodiment of the present invention.

Referring to FIG. 5, the refresh control system may include a controller 510 and a semiconductor memory device 520.

The controller 510 may control whether to perform a smart refresh operation based on a latching duration time of an address successively accessed during an active operation and the smart refresh maximum warranty time INF_TSMT described above with reference to FIG. 1. The memory controller 510 may receive the smart refresh maximum warranty time INF_TSMT, and may generate a command signal CMD corresponding to the normal refresh operation and the smart refresh operation. The latching duration time of the successively accessed address may mean a time for latching the same address by a smart refresh address latch unit 630, which will be described later with reference to FIG. 6.

The semiconductor memory device 520 may perform the normal refresh operation and the smart refresh operation in response to the command signal CMD. The semiconductor memory device 520 may include a plurality of memory cells and may store data DAT corresponding to an address signal ADD in the memory cells or output the stored data DAT.

The refresh control system in accordance with the exemplary embodiments of the present invention may control the normal refresh operation and the smart refresh operation in response to the smart refresh maximum warranty time INF_TSMT.

Figure 6:
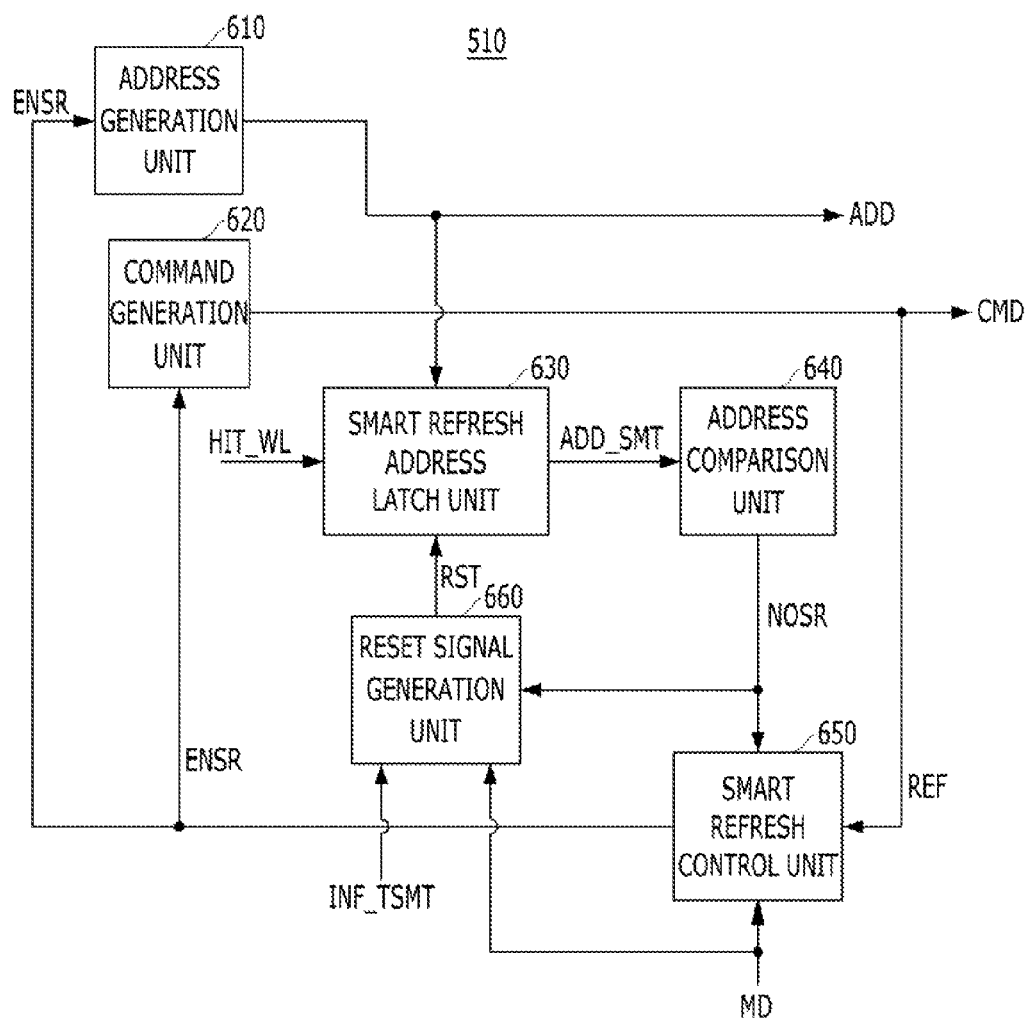
FIG. 6 is a detailed block diagram illustrating a controller shown in FIG. 5.

FIG. 6 is a detailed block diagram illustrating the controller 510 shown in FIG. 5.

Referring to FIG. 6, the controller 510 may include an address generation unit 610, a command generation unit 620, a smart refresh address latch unit 630, an address comparison unit 640, a smart refresh control unit 650, and a reset signal generation unit 660. The smart refresh address latch unit 630, the address comparison unit 640, the smart refresh control unit 650, and the reset signal generation unit 660 may be the same as the smart refresh address latch unit 120, the address comparison unit 130, the smart refresh control unit 141, and the reset signal generation unit 170 described above with reference to FIGS. 1 to 4B.

The address generation unit 610 may generate the address signal ADD accessed during the active operation, which may include the smart refresh address signal ADD_SMT accessed during the smart refresh operation in response to the activation control signal ENSR.

The command generation unit 520 may generate the command signal CMD for controlling the semiconductor memory device 520 in response to the activation control signal ENSR. The command signal CMD may be for one or more of the active operation, a write operation, a read operation and the like of the semiconductor memory device 520, and particularly, the command signal CMD may be for the normal refresh operations and smart refresh operations of the semiconductor memory device 520. The command signal CMD may include a refresh command signal REF.

The smart refresh address latch unit 630 may latch the smart refresh address signal ADD_SMT corresponding to the smart refresh operation in response to the word line hit signal HIT_WL. The address comparison unit 640 may compare the smart refresh address signal ADD_SMT latched by the smart refresh address latch unit 630, and particularly, may compare the previously latched smart refresh address signal ADD_SMT with the currently latched smart refresh address signal ADD_SMT. The smart refresh control unit 550 may generate the activation control signal ENSR by counting the refresh command signal REF.

The reset signal generation unit 660 may generate the reset signal RST by counting the activation of the comparison result signal NOSR of the address comparison unit 540, and comparing the counted number of activations of the comparison result signal NOSR with the smart refresh maximum warranty time INF_TSMT.

The comparison result signal NOSR of the address comparison unit 640 may have information on whether the previously latched smart refresh address signal ADD_SMT is identical to the currently latched smart refresh address signal ADD_SMT. Accordingly, by comparing the comparison result signal NOSR of the address comparison unit 640 with the smart refresh maximum warranty time INF_TSMT, the smart refresh address latch unit 630 may detect whether the smart refresh address signal ADD_SMT has been latched in the smart refresh address latch unit 630 for a time longer than the smart refresh maximum warranty time INF_TSMT. When the smart refresh address signal ADD_SMT has been latched in the smart refresh address latch unit 630 for a time longer than the smart refresh maximum warranty time INF_TSMT, the reset signal RST may be activated, and the smart refresh address latch unit 630 may be initialized in response to the activation of the reset signal RST. The operation of the refresh control system may be the same as CASE IV of FIG. 4B. That is, by activating the reset signal RST when the smart refresh address signal ADD_SMT has been latched by the smart refresh address latch unit 630 for a time longer than the smart refresh maximum warranty time INF_TSMT, for example a single cycle or 4 inputs of the refresh command signal REF, the memory controller 510 may control the smart refresh operation 'SR' to be performed as shown in the third refresh cycle of CASE IV shown in FIG. 4B; otherwise, the memory controller 510 may control the normal refresh 'IREF' to be performed as the second cycle of CASE IV shown in FIG. 4B.

In conclusion, the semiconductor memory device 520 of FIG. 5 may provide the smart refresh maximum warranty time INF_TSMT including the process characteristics such as memory cells, word lines and the like, to the memory controller 510, and the memory controller 510 may generate the command signal CMD corresponding to the normal refresh operation and the smart refresh operation based on the smart refresh maximum warranty time INF_TSMT.

The reset signal generation unit 660 may be deactivated in the direct mode, and may be activated in the comparing mode according to the mode selection signal MD.

Meanwhile, the address generation unit 610 may generate the smart refresh address signal ADD_SMT in response to the activation control signal ENSR. This means that the memory controller 510 of FIG. 5 may provide a smart refresh command signal and the smart refresh address signal ADD_SMT, which correspond to the smart refresh operation.

The refresh control system in accordance with the exemplary embodiment of the present invention may generate the command signal CMD corresponding to the normal refresh operation and the smart refresh operation based on the smart refresh maximum warranty time INF_TSMT varying depending on characteristics of the semiconductor memory device 520, and selectively perform the normal refresh operation and the smart refresh operation of the semiconductor memory device 520 in response to the command signal CMD.

According to the exemplary embodiments of the present invention as described above, the semiconductor memory device may control a smart refresh operation by detecting an address successively accessed during an active operation, and efficiently control overall refresh operations.

While the present invention has been described with respect to the specific embodiments, it will be apparent to those skilled in the art that various changes and modifications may be made without departing from the spirit and scope of the invention as defined in the following claims.

For instance, positions and types of logic gates and transistors exemplified in the above-described embodiment could be differently realized according to the polarities of the signals inputted thereto. Also, the smart refresh address ADD_SMT[12:0] may correspond to the successively-activated word line. For another example, the smart refresh address ADD_SMT[12:0] may correspond to the word lines adjacent to the successively-activated word line. It just an example that the refresh operation unit 160 or the semiconductor memory device 520 may perform the smart refresh operation based on the smart refresh address ADD_SMT[12:0] representing one of the successively-activated word lines or the adjacent word lines. In any case, the refresh operation unit 160 or the semiconductor memory device 520 may perform the smart refresh operation.

What is claimed is:

1. A semiconductor memory device comprising:
   an address latch unit suitable for consecutively latching first refresh addresses, which correspond to successively-activated word lines, from consecutively received addresses for word lines to be activated in response to word line hit signals identifying the successively-activated word lines;
   an address comparison unit suitable for generating a comparison result signal by comparing the previously latched first address with the currently latched first address;
   a refresh control unit suitable for selecting one of a first refresh operation corresponding to the currently latched first address, and a second refresh operation corresponding to a second address in response to the comparison result signal, and a refresh command signal; and
   a refresh operation unit suitable for performing the first and second refresh operations on memory cells therein according to the selection of the refresh control unit.

2. The semiconductor memory device of claim 1, further comprising:
   an address generation unit suitable for generating the second address; and
   an address output unit suitable for outputting one of the first address latched by the address latch unit and the second address according to the selection of the refresh control unit.

3. The semiconductor memory device of claim 1, wherein the refresh control unit selects the second refresh operation when the previously latched first address is the same as the currently latched first address.

4. The semiconductor memory device of claim 1, wherein the refresh control unit comprises:
   a first refresh control unit suitable for generating an activation control signal for the first refresh operation per preset input numbers of the refresh command signal in response to the comparison result signal; and
   a refresh selection unit suitable for outputting a refresh control signal corresponding to one of the first refresh operation and the second refresh operation in response to the refresh command signal, and the activation control signal.

5. The semiconductor memory device of claim 4, wherein the first refresh control unit comprises:
   a shifting section suitable for performing a shift operation in response to the refresh command signal; and
   an output control section suitable for outputting an output signal of the shifting section as the activation control signal in response to the comparison result signal.

6. The semiconductor memory device of claim 1, further comprising:
   a mode control section suitable for activating or deactivating the comparison result signal.

7. The semiconductor memory device of claim 1, wherein the refresh control unit selects the first refresh operation in response to a predetermined first input sequence of the refresh command signal in a direct mode.

8. The semiconductor memory device of claim 1, wherein the refresh control unit selects the first refresh operation in response to a predetermined first input sequence of the refresh command signal when the previously latched first address is different from the currently latched first address in a comparing mode.

9. The semiconductor memory device of claim 1, wherein the refresh control unit selects the second refresh operation in response to a predetermined first input sequence of the refresh command signal when the previously latched first address is the same as the currently latched first address in a comparing mode.

10. The semiconductor memory device of claim 1, wherein the refresh control unit selects the second refresh operation in response to a predetermined second input sequence of the refresh command signal.

11. A refresh control system comprising:
    a controller suitable for generating a refresh command signal, and suitable for generating one of a first refresh address and a second refresh address based on a latched time of the first refresh address, which corresponds to a successively-activated word line during an active operation, and a warranty time of the first refresh operation; and
    a semiconductor memory device suitable for performing a first refresh operation corresponding to the first refresh address and the second refresh operation corresponding to a second refresh address in response to the refresh command signal.

12. The refresh control system of claim 11, wherein the controller comprises:
    an address latch unit suitable for consecutively latching first refresh addresses, which correspond to successively-activated word lines, from consecutively received addresses for word lines to be activated in response to word line hit signals identifying the successively-activated word lines;
    an address comparison unit suitable for generating a comparison result signal by comparing the previously latched first address with the currently latched first address;

a refresh control unit suitable for selecting one of a first refresh operation corresponding to the currently latched first address and a second refresh operation corresponding to a second address in response to the comparison result signal, and the refresh command signal; and a command generation unit suitable for generating the refresh command signal corresponding to the first refresh operation according to the selection of the refresh control unit.

13. The refresh control system of claim 12,
wherein the controller further comprises a reset signal generation unit suitable for generating a reset signal in response to the comparison result signal and the warranty time of the first refresh operation,
wherein the address latch unit is reset in response to the reset signal.

14. The refresh control system of claim 13, wherein the reset signal generation unit generates the reset signal by comparing a latched time of the first refresh address latched by the address latch unit with the warranty tame of the first refresh operation.

15. The refresh control system of claim 13, further comprising an address generation unit suitable for generating the first refresh address according to the selection of the refresh control unit, and providing the first refresh address to the semiconductor memory device.

16. The refresh control system of claim 12, wherein the refresh control unit selects the first refresh operation in response to a predetermined first input sequence of the refresh command signal in a direct mode.

17. The refresh control system of claim 12, wherein the refresh control unit selects the first refresh operation in response to a predetermined first input sequence of the refresh command signal when the previously latched first address is different from the currently latched first address in a comparing mode.

18. The refresh control system of claim 12, wherein the refresh control unit selects the second refresh operation in response to a predetermined first input sequence of the refresh command signal when the previously latched first address is the same as the currently latched first address in a comparing mode.

19. The refresh control system of claim 18, wherein the controller further comprises a reset signal generation unit for resetting the address latch unit a predetermined time after the refresh operation unit performs the first refresh operation to the currently latched first address in the comparing mode.

20. The refresh control system of claim 12, wherein the refresh control unit selects the second refresh operation in response to a predetermined second input sequence of the refresh command signal.

* * * * *